United States Patent
Yamada et al.

(10) Patent No.: US 6,337,796 B2
(45) Date of Patent: Jan. 8, 2002

(54) SEMICONDUCTOR DEVICE MOUNT STRUCTURE HAVING HEAT DISSIPATING MEMBER FOR DISSIPATING HEAT GENERATED FROM SEMICONDUCTOR DEVICE

(75) Inventors: Masao Yamada, Kariya; Shinichi Konda, Anjo; Taketoshi Sato, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/852,701

(22) Filed: May 11, 2001

(30) Foreign Application Priority Data

May 19, 2000 (JP) .......................................... 12-148459

(51) Int. Cl.[7] .............................................. H05K 7/20
(52) U.S. Cl. ...................... 361/719; 257/707; 257/719; 257/718
(58) Field of Search ............................... 361/719, 718, 361/717; 257/707, 706, 713, 719, 718

(56) References Cited

U.S. PATENT DOCUMENTS

| 4,110,549 A | * | 8/1978 | Goetze et al. ............. 174/16.3 |
| 4,509,839 A | * | 4/1985 | Lavochkin .................. 257/718 |
| 4,710,852 A |   | 12/1987 | Keen |
| 5,812,376 A | * | 9/1998 | Mach et al. ................. 361/719 |
| 5,870,287 A | * | 2/1999 | Rodriguez et al. .......... 361/704 |
| 5,991,151 A | * | 11/1999 | Capriz ........................ 361/704 |
| 6,049,469 A | * | 4/2000 | Hood, III ................... 361/818 |
| 6,122,170 A | * | 9/2000 | Hirose et al. ............... 361/704 |
| 6,185,100 B1 | * | 2/2001 | Bentz et al. ................. 361/704 |

FOREIGN PATENT DOCUMENTS

| JP | 07-22593 | 4/1995 |
| JP | 09-232487 | 9/1997 |

* cited by examiner

*Primary Examiner*—Albert W. Paladini
*Assistant Examiner*—Jose H. Alcala
(74) *Attorney, Agent, or Firm*—Law Office of David G. Posz

(57) ABSTRACT

A semiconductor device mount structure includes a heat dissipating member, a circuit board, a semiconductor device and a leaf spring member. The heat dissipating member has a mounting surface. The circuit board is opposed to the mounting surface of the heat dissipating member. The semiconductor device is mounted to the mounting surface of the heat dissipating member. The semiconductor device is electrically connected to the circuit board. The leaf spring member is arranged between the semiconductor device and the circuit board in such a manner that the leaf spring member biases the semiconductor device against the mounting surface of the heat dissipating member. The leaf spring member has a heat insulating material integrated on one side thereof which faces the circuit board.

9 Claims, 4 Drawing Sheets

FIG. 5 <u>RELATED ART</u>
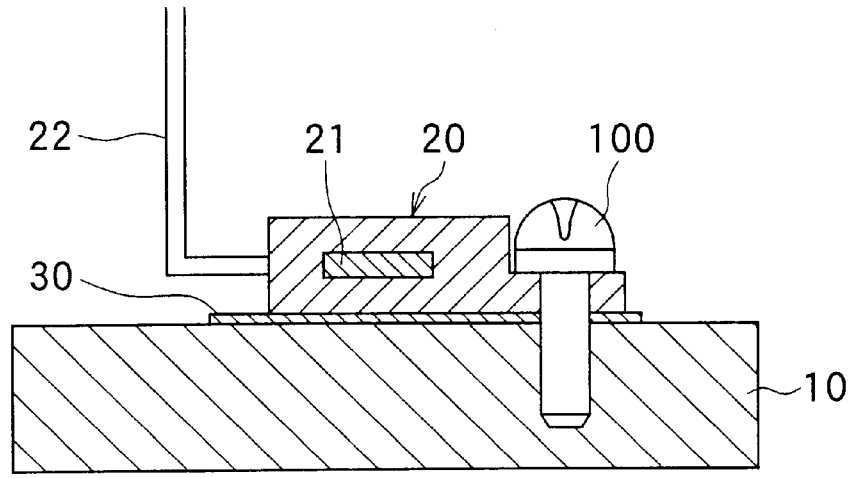
FIG. 6 <u>RELATED ART</u>
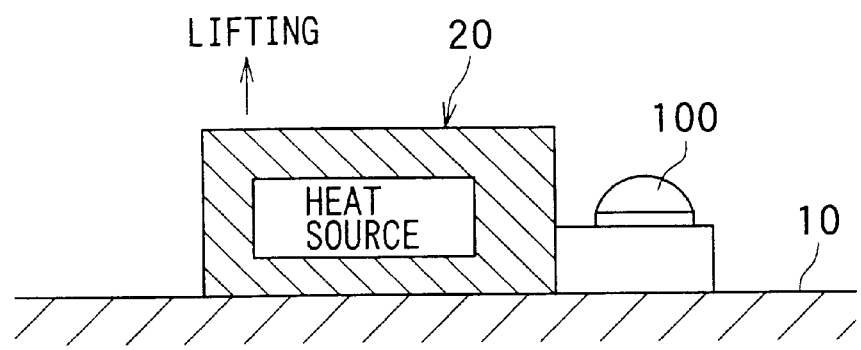

SEMICONDUCTOR DEVICE MOUNT STRUCTURE HAVING HEAT DISSIPATING MEMBER FOR DISSIPATING HEAT GENERATED FROM SEMICONDUCTOR DEVICE

CROSS REFERENCE TO RELATED APPLICATION

This application is based on and incorporates herein by reference Japanese Patent Application No. 2000-148459 filed on May 19, 2000.

BACKGROUND OF THE INVENTION

1. Field of the Invention

The present invention relates to a semiconductor device mount structure in which a semiconductor device is mounted to a heat dissipating member.

2. Description of Related Art

One previously proposed semiconductor device mount structure is schematically shown in FIG. 5. A semiconductor device 20 is constructed as a package in which a semiconductor chip 21, such as a power MOSFET, that generates substantial heat upon operation thereof is encapsulated within a resin encapsulating material through a molding process. A heat dissipating member (fins) 10 is made of a highly heat conductive material, such as copper or aluminum. The semiconductor device 20 is secured to a mounting surface of the heat dissipating member 10 by a screw 100. Leads 22 extend out from the semiconductor device 20 and are electrically connected to a printed circuit board (not shown).

An interface member 30, such as a heat conductive grease material or a heat conductive sheet material, is placed between the semiconductor device 20 and the heat dissipating member 10. Heat generated from the semiconductor chip 21 is conducted to the heat dissipating member 10 through the interface member 30. Then, the heat conducted to the heat dissipating member 10 is dissipated from the heat dissipating member 10, for instance, into the atmosphere.

Since the semiconductor device 20 is secured to the heat dissipating member 10 by the screw 100, the heat dissipating property is greatly influenced by a type of material used for the heat dissipating member 10, a flatness of the mounting surface of the heat dissipating member 10, a screw torque of the screw 100 or the like. Thus, it is difficult to achieve a stable good heat dissipating property (low heat resistance).

That is, as shown in FIG. 6, the screw 100 is not located right above the heat source (mainly the semiconductor chip 21) to bias the heat source against the heat dissipating member 10. Thus, when the screw 100 is tightened, a bottom side of the semiconductor device 20 below the heat source can be lifted from the heat dissipating member 10, so that the heat resistance between the semiconductor device 20 and the heat dissipating member 10 is increased.

Furthermore, in such a mount structure using the screw 100 for securing the semiconductor device 20, the contact between the semiconductor device 20 and the heat dissipating member 10 is greatly influenced by the flatness of the mounting surface of the heat dissipating member 10. In addition, if the heat dissipating member 10 is made of a soft material, such as copper, the tightening of the screw 100 may cause deformation of the mounting surface of the heat dissipating member 10. Thus, the bottom side of the semiconductor device 20 below the heat source may be lifted or spaced from the heat dissipating member 10.

Also, in the mount structure shown in FIG. 5, the circuit board (not shown) to which the leads 22 are connected is arranged above the semiconductor device 20. Thus, the semiconductor device 20 mounted to the heat dissipating member 10 is positioned between the heat dissipating member 10 and the circuit board. As a result, the heat dissipated from the semiconductor device 20 may affect the performance of the circuit board.

SUMMARY OF THE INVENTION

The present invention addresses the above disadvantages. Accordingly, it is an objective of the present invention to provide a semiconductor device mount structure that achieves stable effective heat dissipating property and restrains influences of heat radiated from a semiconductor device on a circuit board arranged above the semiconductor device.

To achieve the objective of the present invention, there is provided a semiconductor device mount structure including a heat dissipating member, a circuit board, a semiconductor device and a leaf spring member. The heat dissipating member has a mounting surface. The circuit board is opposed to the mounting surface of the heat dissipating member. The semiconductor device is mounted to the mounting surface of the heat dissipating member. The semiconductor device is electrically connected to the circuit board. The leaf spring member is arranged between the semiconductor device and the circuit board in such a manner that the leaf spring member biases the semiconductor device against the mounting surface of the heat dissipating member. The leaf spring member has a heat insulating material integrated on one side thereof which faces the circuit board.

The semiconductor device may includes a heat generating element, such as a power MOSFET. The leaf spring member may resiliently contacting the semiconductor device on a portion of a surface of the semiconductor device, which is located along a line that extends perpendicular to the mounting surface of the heat dissipating member and that passes through the heat generating element.

BRIEF DESCRIPTION OF THE DRAWINGS

The present invention will be described by way of exemplary embodiments, but not limitations, illustrated in the accompanying drawings in which like references denote similar elements,,and in which:

FIG. 5 is a schematic cross-sectional view of a previously proposed semiconductor device mount structure; and FIG. 6 is another schematic cross-sectional view of the previously proposed semiconductor device mount structure, showing lifting of the semiconductor device.

DETAILED DESCRIPTION OF THE INVENTION

Various embodiments of the present invention will be described with reference to the accompanying drawings. A semiconductor device mount structure according to each embodiment can be used, for example, for a lighting apparatus of an automobile, such as a daytime running light (DRL).

(First Embodiment)

Figure 1:
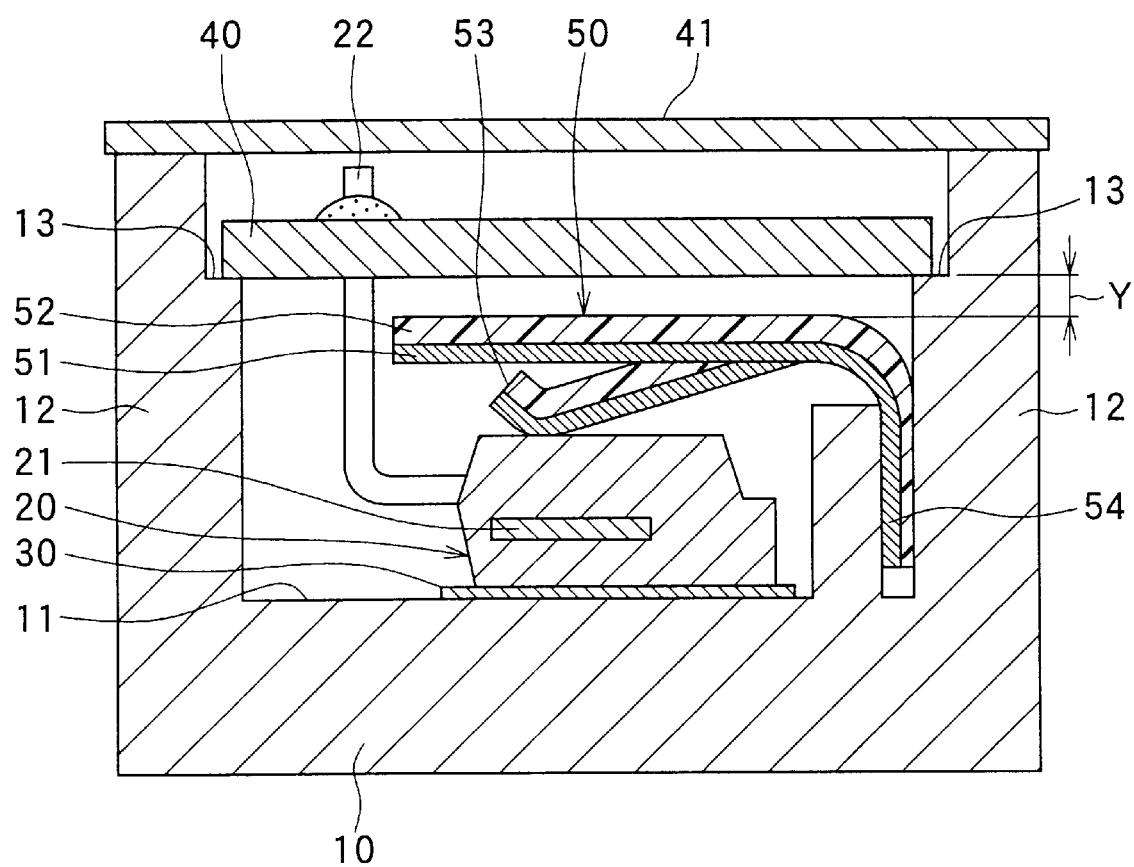
FIG. 1 is a schematic cross-sectional view of a semiconductor device mount structure according to a first embodiment of the present invention.

With reference to FIG. 1, a semiconductor device mount structure according to a first embodiment includes a heat dissipating member (heat dissipating plate, fins) 10. The heat dissipating member 10 is manufactured, for example, by molding or cutting a heat conductive material, such as copper or aluminum. A semiconductor device 20 is mounted to a mounting surface 11 of the heat dissipating member 10 via an interface member 30, such as a heat conductive grease material or a heat conductive sheet material. The semiconductor device 20 is formed as a package in which a semiconductor chip (heat generating element or heat source) 21, such as a power MOSFET, that generates substantial heat upon operation thereof is encapsulated within a resin encapsulating material through a molding process.

The circuit board 40, which can be a printed circuit board, a ceramic circuit board or the like, is arranged above the semiconductor device 20 in such a manner that the circuit board 40 is opposed to the mounting surface 11 of the heat dissipating member 10. The heat dissipating member 10 has a side wall portion 12 that protrudes upwardly from the mounting surface 11 of the heat dissipating member 10. The circuit board 40 is secured to a step 13 formed in the side wall portion 12 by an adhesive, a screw or the like.

Leads 22 extend out from the semiconductor device 20 toward the circuit board 40. The leads 22 are electrically connected to the circuit board 40, for example, by soldering. A lid 41 is secured to a top end of the side wall portion 12 to protect components received within the heat dissipating member 10.

Thus, the semiconductor device 20 is mounted to the mounting surface 11 of the heat dissipating member 10 and is electrically connected to the circuit board 40. A leaf spring member 50 that exerts a biasing force to bias and to secure the semiconductor device 20 against the mounting surface 11 of the heat dissipating member 10 is arranged between the semiconductor device 20 and the circuit board 40.

A construction and a manufacturing process of the leaf spring member 50 will be briefly described with reference to FIGS. 2A and 2B. The leaf spring member 50 is manufactured from a double layered plate material that is formed by adhering a spring material 51, such as stainless steel material, to a heat insulating material 52, such as a heat insulating resin material (e.g., urethane or foam material) by means of a sealing adhesive material.

Figure 2A:
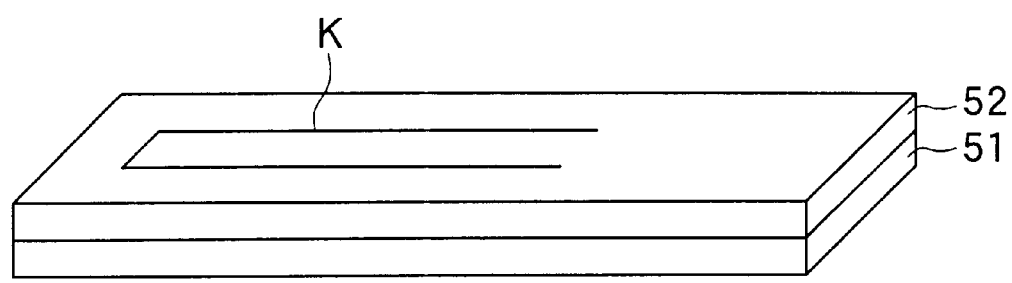
FIG. 2A is a schematic perspective view of a double layered plate material of a leaf spring member according to the first embodiment right after a die-cutting process.
Figure 2B:
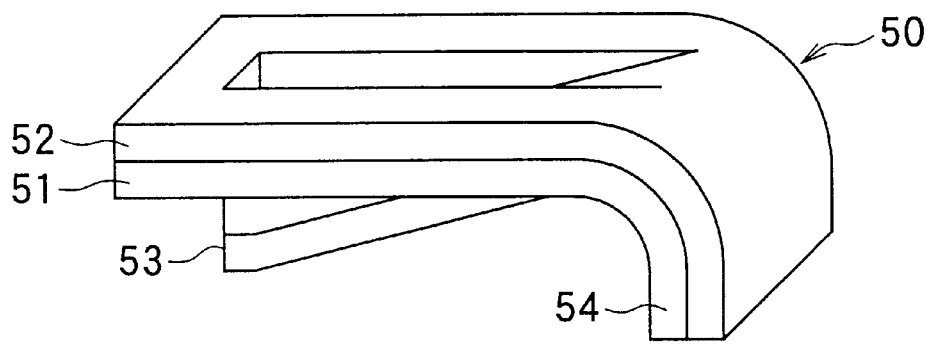
FIG. 2B is a schematic perspective view of the double layered plate material of the leaf spring member according to the first embodiment after a bending process.

Specifically, as shown in FIG. 2A, a portion of the double layered plate material, for example, is die-cut to form a generally horseshoe-shaped cut K in a die-cutting process. Then, as shown in FIG. 2B, a rectangular tab defined inside of the horseshoe-shaped cut K is bent to form a bent portion 53 that biases the semiconductor device 20. Furthermore, at a base side of the bent portion 53, the double layered plate material or leaf spring member 50 is further bent into a L-shape to form a connecting portion 54 that is used to connect the leaf spring member 50 to the heat dissipating member 10.

With reference to FIG. 1, the thus manufactured leaf spring member 50 is mounted to the heat dissipating member 10 in such a manner that the connecting portion 54 of the leaf spring member 50 is press fitted into a receiving recess formed in the heat dissipating member 10. Upon installation of the leaf spring member 50, the spring material 51 and the heat insulating material 52 of the leaf spring member 50 face the semiconductor device 20 and the circuit board 40, respectively. Thus, the leaf spring member 50 is supported by the heat dissipating member 10, and the semiconductor device 20 and the circuit board 40 are shielded from each other by the leaf spring member 50. The leaf spring member 50 can be alternatively supported by any other appropriate means.

When the leaf spring member 50 is mounted to the heat dissipating member 10, a distal end of the bent portion 53 of the leaf spring member 50 resiliently contacts the semiconductor device 20 on a portion of a surface of the semiconductor device 20, which is located along a line that extends perpendicular to the mounting surface 11 of the heat dissipating member 10 and that passes through the semiconductor chip 21. Thus, the semiconductor device 20 is biased against the mounting surface 11 of the heat dissipating member 10 by the bent portion 53 of the leaf spring member 50 located right above the semiconductor chip 21.

In the above-described mount structure, the semiconductor device 20 and the circuit board 40 constitute, for example, a control circuit of the automobile lighting apparatus. The heat generated from the semiconductor chip 21 of the semiconductor device 20 is conducted to the heat dissipating member 10 through the interface member 30. Then, the heat conducted to the heat dissipating member 10 is dissipated from the heat dissipating member 10, for instance, into the atmosphere or to other heat dissipating member (other heat sink). Furthermore, a portion of the heat generated from the semiconductor chip 21 is also conducted to the spring material 51 of the leaf spring member 50 that directly contacts the semiconductor device 20 right above the semiconductor chip 21, and the heat conducted to the spring material 51 of the leaf spring member 50 is then conducted to the heat dissipating member 10 and then is dissipated therefrom.

In the above-described mount structure, the biasing force of the leaf spring member 50 is applied to the semiconductor device 20 on the portion of the surface of the semiconductor device 20, which is located along the line that extends perpendicular to the mounting surface 11 of the heat dissipating member 10 and that passes through the semiconductor chip 21. Thus, the base portion of the semiconductor device 20 which is located below the semiconductor chip 21 is not easily lifted from the mounting surface 11 of the heat dissipating member 10.

Furthermore, the heat insulating material 52 is integrally provided on the one side of the leaf spring member 50 which faces the circuit board 40. Thus, the heat radiated from the semiconductor device 20 is shielded or is insulated by the heat insulating material 52 of the leaf spring member 50. The influences of the heat radiated from the semiconductor device 20 on the circuit board 40 can be restrained by placing any other type of heat insulating member between the semiconductor device 20 and the circuit board 40.

For instance, a heat insulating material can be directly adhered to a surface of the circuit board 40 which faces the semiconductor device 20. In this manner, the heat sensitive circuit board (such as the printed circuit board) 40 and heat sensitive SMD (Surface Mount Device) components mounted to the circuit board 40 can be protected from the heat radiated from the semiconductor device 20.

However, in such a case, the heat insulating material is handled as one component, so that the number of components to be assembled is disadvantageously increased. Furthermore, a step of adhering the heat insulating material to the circuit board is further added, so that the number of the assembling steps is increased. However, according to the above-described embodiment, the heat insulating material 52 is integrated into the leaf spring member 50, so that the number of the components and the number of assembling steps can be advantageously minimized, or the assembling work can be advantageously eased.

Furthermore, in the above-described mount structure, by interposing the heat conductive grease between the semiconductor device 20 and bent portion 53 of the leaf spring member 50 or between the heat dissipating member 10 and the connecting portion 54 of the leaf spring member 50, a contact surface area between these components can be advantageously increased, resulting in an improvement of the heat dissipating property.

Also, in the above-described mount structure, the heat insulating material 52 of the leaf spring member 50 is made of the heat insulating resin material, such as urethane or foam material, which is dielectric. Thus, it is possible to achieve both the heat insulation and the electric insulation between the leaf spring member 50 and the circuit board 40.

The semiconductor device 20 shown in FIG. 1 has the fully molded structure in which the entire semiconductor chip 21 is encapsulated within the resin encapsulating material. However, in order to further improve the heat dissipating property of the semiconductor chip 21, it is possible to use a half-molded structure in which a base surface of the semiconductor chip 21 is exposed from the resin encapsulating material. Furthermore, the heat conductive grease having a lower heat resistance is used as the interface member 30 between the base surface of the semiconductor chip 21 and the mounting surface 11 of the heat dissipating member 10. In the case of the semiconductor device 20 having the half-molded structure, for instance, if the semiconductor chip 21 is the power MOSFET, a drain potential may be present in the base surface of the semiconductor chip 21, and the same drain potential may also be present in both the heat dissipating member 10 and the leaf spring member 50.

Thus, it is preferred that the heat insulating material 52 has a dielectric property in addition to the heat insulating property. If the heat insulating material 52 is dielectric, the heat insulating material 52 can prevent electrical influences or short circuits, for example, on the circuit board 40 and the SMD components on the circuit board 40 induced by the drain potential present in the leaf spring member 50. In such a case, a clearance Y between the leaf spring member 50 and the circuit board 40 shown in FIG. 1 can be eliminated. In this way, a size of the mount structure can be advantageously reduced.

Furthermore, if the heat insulating material 52 of the leaf spring member 50 is dielectric, the circuit board 40 may be directly secured to the leaf spring member 50 by placing a seal material, such as an adhesive, an adhesive sheet or the like, between the heat insulating material 52 and the circuit board 40. Thus, relative positioning of the these parts becomes much easier, and the number of the assembling steps can be reduced.

In the above-described mount structure, a surface area or size of the leaf spring member 50 located above the semiconductor device 20 is preferably larger than that of the semiconductor device 20 to shield the circuit board 40 from the semiconductor device 20. In this manner, it is possible to reduce the influences of the heat radiated from the semiconductor device 20 on the circuit board 40 and the other components mounted to the circuit board 40.

As described above, the mount structure of the present embodiment provides the various advantages and restrains the influences of the heat radiated from the semiconductor device 20 on the circuit board 40 while achieving the stable heat dissipating property.

(Second Embodiment)

Figure 3:
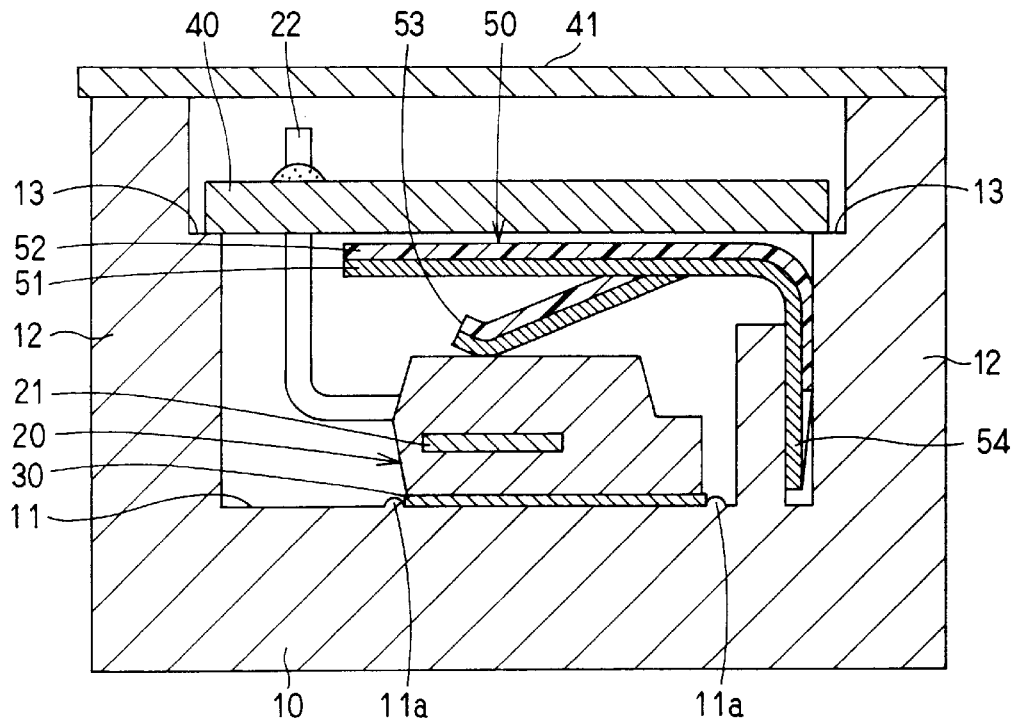
FIG. 3 is a schematic cross-sectional view of a semiconductor device mount structure according to a second embodiment of the present invention.
Figure 4A:
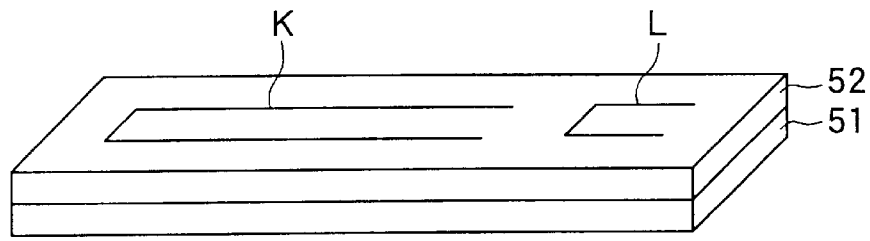
FIG. 4A is a schematic perspective view of a double layered plate material of a leaf spring member according to the second embodiment right after a die-cutting process.
Figure 4B:
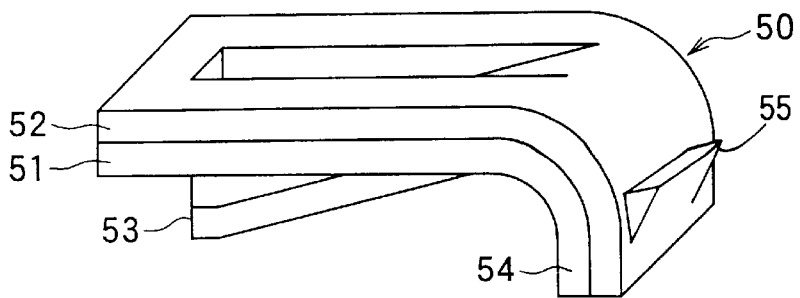
FIG. 4B is a schematic perspective view of the double layered plate material of the leaf spring member according to the second embodiment after a bending process.

A semiconductor device mount structure according to a second embodiment of the present invention will be described with reference to FIGS. 3, 4A and 4B.

The semiconductor device mount structure of the second embodiment is substantially the same as that of the first embodiment except that the mount structure of the second embodiment has a peripheral rib 11a and a resilient claw 55. The peripheral rib 11a protrudes from the mounting surface 11 of the heat dissipating member 10 and continuously extends along the outer peripheral portion of the base of the semiconductor device 20. Since the semiconductor device 20 is mainly secured by the biasing force exerted onto it from the bent portion 53 of the leaf spring member 50, the semiconductor device 20 could be displaced on the mounting surface 11 of the heat dissipating member 10 when it encounters, for example, shocks, vibrations or thermal expansion and contraction (for instance, encountered during a heating and cooling cycle). The peripheral rib 11a advantageously restrains the displacement of the semiconductor device 20 on the mounting surface 11 of the heat dissipating member 10.

The resilient claw 55 is provided in the connecting portion 54 of the leaf spring member 50. When the connecting portion 54 of the leaf spring member 50 is inserted within the receiving recess formed in the heat dissipating member 10, the resilient claw 55 is resiliently biased against the wall of the receiving recess or the side wall portion 12 of the heat dissipating member 10, so that the leaf spring member 50 is more tightly secured to the heat dissipating member 10. As a result, the leaf spring member 50 is less likely to come out from the receiving recess formed in the heat dissipating member 10 when it encounters shocks, vibrations or the like, so that the stable biasing force of the leaf spring member 50 against the semiconductor device 20 can be further ensured.

The resilient claw 55 is formed in the following manner. That is, as shown in FIG. 4A, a generally horseshoe-shaped cut L is formed in the double layered plate material along with the horseshoe-shaped cut K through the die-cutting process. Then, as shown in FIG. 4B, a rectangular tab defined inside of the horseshoe-shaped cut L is bent to form the resilient claw 55.

In the second embodiment, the peripheral rib 11a extends continuously along the outer peripheral portion of the base of the semiconductor device 20. Alternatively, the peripheral rib 11a can be discontinuously provided along the outer peripheral portion of the base of the semiconductor device 20.

The peripheral ribs 11a and the resilient claw 55 of the second embodiment allows the semiconductor device 20 to be secured in place with the stable biasing force. Thus, the semiconductor device 20 is less likely to move around on the mounting surface 11 of the heat dissipating member 10. In this manner, it is further ensured that the biasing force of the leaf spring member 50 is applied to the semiconductor device 20 on the portion of the surface of the semiconductor device 20, which is located along the line that extends perpendicular to the mounting surface 11 of the heat dissipating member 10 and that passes through the semiconductor chip 21. Thus, the base portion of the semiconductor device 20 which is located below the heat source (semiconductor chip 21) is not lifted from the mounting surface 11 of the heat dissipating member 10.

Additional advantages and modifications will readily occur to those skilled in the art. The invention in its broader terms is therefore, not limited to the specific details, representative apparatus, and illustrative examples shown and described.

What is claimed is:

1. A semiconductor device mount structure comprising:

a heat dissipating member having a mounting surface;

a circuit board opposed to said mounting surface of said heat dissipating member;

a semiconductor device mounted to said mounting surface of said heat dissipating member, said semiconductor device being electrically connected to said circuit board; and a leaf spring member arranged between said semiconductor device and said circuit board in such a manner that said leaf spring member biases said semiconductor device against said mounting surface of said heat dissipating member, said leaf spring member having a heat insulating material integrated on one side thereof which faces said circuit board.

2. A semiconductor device mount structure comprising:

a heat dissipating member having a mounting surface;

a circuit board opposed to said mounting surface of said heat dissipating member;

a semiconductor device having a heat generating element, said semiconductor device being mounted to said mounting surface of said heat dissipating member, said semiconductor device being electrically connected to said circuit board; and a leaf spring member arranged between said semiconductor device and said circuit board in such a manner that said leaf spring member biases said semiconductor device against said mounting surface of said heat dissipating member, said leaf spring member resiliently contacting said semiconductor device on a portion of a surface of said semiconductor device, said portion of said surface of said semiconductor device being located along a line that extends perpendicular to said mounting surface of said heat dissipating member and that passes through said heat generating element, said leaf spring member having a heat insulating material integrated on one side thereof which faces said circuit board.

3. A semiconductor device mount structure according to claim 1, wherein said leaf spring member has a bent portion that biases said semiconductor device, said bent portion being manufactured from a plate material in such a manner that a cut corresponding to said bent portion is made in said plate material, and then said bent portion is bent on a side where said semiconductor device is located.

4. A semiconductor device mount structure according to claim 1, wherein:

said heat dissipating member includes a receiving recess; and a portion of said leaf spring member is inserted within said receiving recess of said heat dissipating member such that said leaf spring member is stationarily supported within said receiving recess of said heat dissipating member.

5. A semiconductor device mount structure according to claim 1, wherein said heat insulating material is dielectric.

6. A semiconductor device mount structure according to claim 5, wherein said heat insulating material is made of a heat insulating resin material.

7. A semiconductor device mount structure according to claim 1, wherein a surface area of said leaf spring member located above said semiconductor device is larger than that of said semiconductor device to shield said circuit board from said semiconductor device.

8. A semiconductor device mount structure according to claim 1, wherein said heat dissipating member includes a peripheral rib that extends along an outer peripheral portion of a base of said semiconductor device on said mounting surface of said heat dissipating member.

9. A semiconductor device mount structure according to claim 1, wherein said leaf spring member includes a resilient claw that is resiliently biased against a wall of said receiving recess of said heat dissipating member.

* * * * *